(12) United States Patent
Cho et al.

(10) Patent No.: US 8,003,485 B2
(45) Date of Patent: Aug. 23, 2011

(54) SEMICONDUCTOR DEVICE AND METHOD OF FABRICATING THE SAME

(75) Inventors: Yong-Tae Cho, Icheon-si (KR); Hae-Jung Lee, Icheon-si (KR); Eun-Mi Kim, Icheon-si (KR); Kyeong-Hyo Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 204 days.

(21) Appl. No.: 12/318,466

(22) Filed: Dec. 30, 2008

(65) Prior Publication Data

US 2010/0025806 A1 Feb. 4, 2010

(30) Foreign Application Priority Data

Aug. 4, 2008 (KR) .................... 10-2008-0076031

(51) Int. Cl.
*H01L 29/78* (2006.01)
*H01L 21/762* (2006.01)

(52) U.S. Cl. ......... 438/424; 257/E21.546; 257/E29.255; 257/506; 438/207; 438/427

(58) Field of Classification Search .................. 257/506, 257/E21.546, E29.255; 438/207, 218, 219, 438/294, 424, 427

See application file for complete search history.

(56) References Cited

U.S. PATENT DOCUMENTS

| 5,918,131 A * | 6/1999 | Hsu et al. ...................... 438/296 |
| 2007/0072389 A1* | 3/2007 | Cho et al. ...................... 438/427 |

FOREIGN PATENT DOCUMENTS

KR 1020070070890 7/2007

OTHER PUBLICATIONS

Translation of KR1020070070890.*
Korean Office Action for application No. 10-2008-0076031.

* cited by examiner

*Primary Examiner* — Victor A Mandala
*Assistant Examiner* — Whitney Moore
(74) *Attorney, Agent, or Firm* — Lowe Hauptman Ham & Berner LLP

(57) ABSTRACT

In a semiconductor device and related method of fabricating the same, a hard mask layer is formed over a substrate, portions of the hard mask layer and the substrate are etched to form trenches having protruding portions at sidewalls, and an insulation layer buried in the trenches is formed to form device isolation regions having protruding portions at sidewalls, wherein the device isolation regions decrease a portion of a width of active regions.

12 Claims, 12 Drawing Sheets

A - A'

B - B'

A - A'

B - B'

A - A'

B – B'

A - A'

B - B'

A - A'

B - B'

A - A'

B - B'

SEMICONDUCTOR DEVICE AND METHOD OF FABRICATING THE SAME

CROSS-REFERENCE TO RELATED APPLICATIONS

The present application claims priority of Korean patent application number 10-2008-0076031, filed on Aug. 4, 2008, which is incorporated herein by reference in its entirety.

BACKGROUND

The present disclosure relates to a semiconductor device, and more particularly, to a transistor in a semiconductor device, and a method of fabricating the same.

Recently, the design rule has continuously decreased as semiconductor devices have been highly integrated. The decreased design rule generally results in limitations such as short channel effect and junction leakage current. Such limitations often deteriorate the refresh characteristic of semiconductor devices. Thus, a typical method went further from the typical planar type structure and introduced diversified transistor structures including a recess type structure, a fin type structure, and a saddle fin type structure.

Fabricating the recess type transistor includes etching an active region to a certain depth and forming a gate electrode over a substrate to increase the channel length and reduce junction leakage current.

Fabricating the fin type transistor includes etching a device isolation region to a certain depth in a manner that an upper portion of an active region protrudes and forming a gate line over a substrate which intersects the active region. The upper portion of the active region vertically protruding from the surface of the device isolation region is referred to as a fin active region hereinafter. In the fin type transistor fabricated as described above, three sides of the fin active region are surrounded by the gate line, which in turn increases the channel length and improves current drivability of a memory device.

Fabricating the saddle fin type transistor includes one or more steps from the methods of fabricating both the recess type transistor and the fin type transistor described above. Thus, the channel length may be increased, junction leakage current may be reduced, and current drivability of a memory device may be improved. In the following description, a method of fabricating a typical saddle fin type transistor and related limitations are described in detail.

FIGS. 1A to 3C illustrate stages in a method of fabricating a typical saddle fin type transistor. FIGS. 1A, 2A, and 3A illustrate perspective views of a typical saddle fin type transistor. FIGS. 1B, 2B, and 3B illustrate cross-sectional views taken along a first direction A-A' of the typical saddle fin type transistor shown in FIGS. 1A, 2A, and 3A, respectively. FIGS. 1C, 2C, and 3C illustrate cross-sectional views taken along a second direction B-B' of the typical saddle fin type transistor shown in FIGS. 1A, 2A, and 3A, respectively.

Referring to FIGS. 1A to 1C, stages are depicted in a shallow trench isolation (STI) process performed on a substrate 100 to form device isolation regions 110. Consequently, active regions of the substrate 100 are defined.

The STI process includes forming a hard mask layer (not shown) over the substrate 100. First photoresist patterns (not shown) are formed over the hard mask layer, the first photoresist patterns having a certain spacing distance from each other and extended along the first direction A-A'.

The hard mask layer and the substrate 100 are etched to a certain depth using the first photoresist patterns as an etch barrier to form trenches. The trenches are formed to have vertical sidewalls. Thus, the trenches are formed to have a uniform width, regardless of the depth.

An insulation layer is formed over the substrate structure. A planarizing process is performed on the resulting substrate structure until a surface of the substrate 100 is exposed. As a result, the device isolation regions 110 are formed and the active regions are defined. Thus, a width of the active regions, as represented by reference denotation $W_1$, is determined, and the active regions obtain a uniform value irrespective of the height.

Referring to FIGS. 2A to 2C, second photoresist patterns (not shown) are formed over the substrate structure. The second photoresist patterns are formed to expose a gate line region. The gate line region refers to a region where a subsequent gate line is to be formed. The gate line region is formed to intersect the active regions, extended along the second direction B-B'.

The active regions and the device isolation regions 110 are selectively etched using the second photoresist patterns as an etch barrier to form a saddle fin type structure. Reference numeral 110A represents etched device isolation regions 110A.

In more detail, portions of the active regions exposed by the second photoresist patterns are etched to a first depth $D_1$ using the second photoresist patterns as an etch barrier to form a recess type structure. Exposed portions of the device isolation regions 110 are etched to a second depth $D_2$ using the second photoresist patterns as an etch barrier to form a fin type structure where the etched active regions protrude in a vertical direction. Thus, the etched device isolation regions 110A are formed. The second depth $D_2$ has a larger value than the first depth $D_1$. Consequently, a saddle fin type structure including a recess type structure and a fin type structure is formed.

In this saddle fin type structure, reference box $A_1$ represents fin active regions vertically protruding from a surface of the etched device isolation regions 110A. At this time, a height of the fin active regions $A_1$ above an upper surface of the etched device isolation regions 110A is represented by reference arrow $D_3$ and corresponds to the height difference between the first depth $D_1$ and the second depth $D_2$.

Referring to FIGS. 3A to 3C, a gate insulation layer 120 is formed over a portion of the substrate structure 100. A gate line 130 is formed over a gate line region. The gate line 130 includes a stack structure of a first conductive layer 130A and a second conductive layer 130B.

An impurity ion implantation process is performed on portions of the active regions on both sides of the gate line 130 to form source and drain regions.

In the above described structure, the ratio between a width $W_2$ and a length $W_3$ of an upper surface of the fin active regions $A_1$ may be improved to enhance the threshold voltage (Vt) margin. In other words, the width $W_2$ may be reduced and the length $W_3$ may be increased.

However, the width $W_1$ of the active regions needs to be decreased when forming the device isolation regions 110 in order to reduce the width $W_2$ of the upper surface of the fin active regions $A_1$. In this case, there is a limitation in that the typical profile is changed. Furthermore, if the width $W_2$ of the fin active regions $A_1$ is decreased, the size of the active regions also decreases. This causes another limitation in that it increases contact resistance.

Moreover, if the length $W_3$ of the upper surface of the fin active regions $A_1$ is increased, the possibility of a short circuit occurring during a subsequent process for forming a landing plug contact (LPC) also increases. Therefore, there are limitations as to increasing the length $W_3$ of the fin active regions $A_1$. Consequently, a new or improved approach to improving the ratio between the width $W_2$ and the length $W_3$ of the upper surface of the fin active regions $A_1$ is believed to be beneficial.

SUMMARY

One or more embodiments are a semiconductor device, which can improve memory device characteristics by forming a device isolation region having protruding portions at sidewalls to enhance the ratio between a width and a length of a fin active region, and a method of fabricating the same.

In accordance with one or more embodiments, a method of fabricating a semiconductor device, includes: forming a hard mask layer over a substrate; etching portions of the hard mask layer and the substrate to form trenches having protruding portions at sidewalls; and forming an insulation layer buried in the trenches to form device isolation regions having protruding portions at sidewalls, wherein the device isolation regions decrease a portion of a width of active regions.

In accordance with one or more embodiments, a semiconductor device includes a fin type transistor, wherein side portions of fin active regions protruding from device isolation regions have a slope less steep than side portions of active regions buried between the device isolation regions.

BRIEF DESCRIPTION OF THE DRAWINGS

Various embodiments are illustrated by way of example, and not by limitation, in the figures of the accompanying drawings.

DESCRIPTION OF EMBODIMENTS

Other objects and advantages of one or more embodiments can be understood by the following description, and become apparent with reference to the one or more embodiments.

One or more embodiments relate to a method of fabricating a semiconductor device. According to one or more embodiments, a width of an active region may be selectively reduced while forming a device isolation region over a substrate by forming the device isolation region in a manner to have protruding portions at sidewalls. Therefore, a width of a fin active region may be selectively reduced when forming a fin type transistor or a saddle fin type transistor. Consequently, the threshold voltage margin may be enhanced to improve memory device characteristics.

Figure 1A:
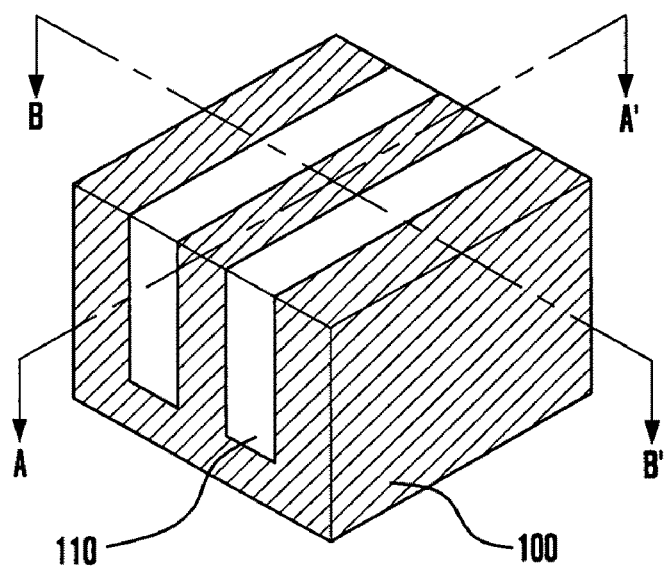
FIGS. 1A to 3C illustrate stages in a method of fabricating a typical saddle fin type transistor.
Figure 1B:
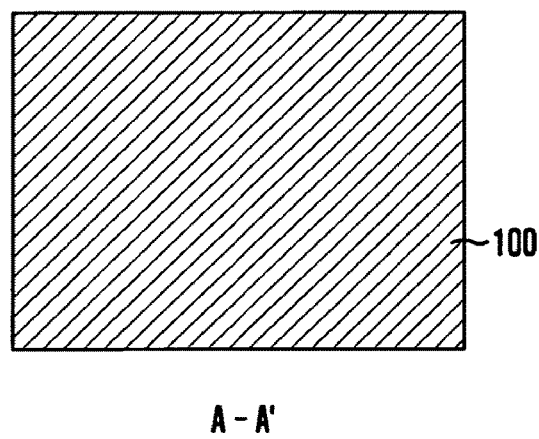
Figure 1C:
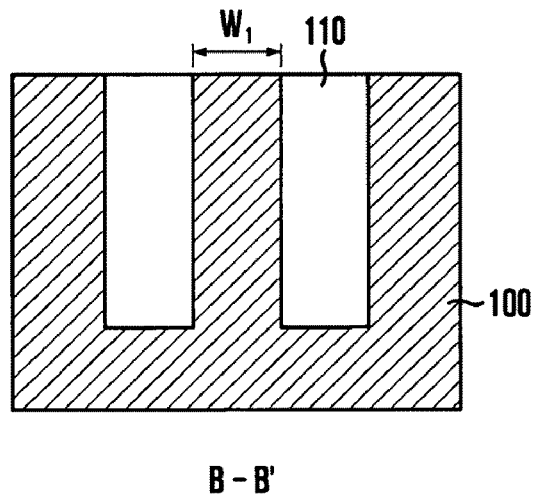
Figure 2A:
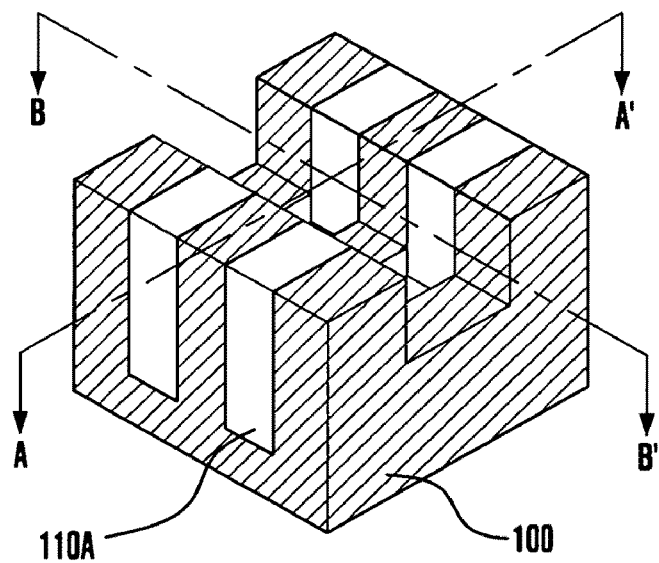
Figure 2B:
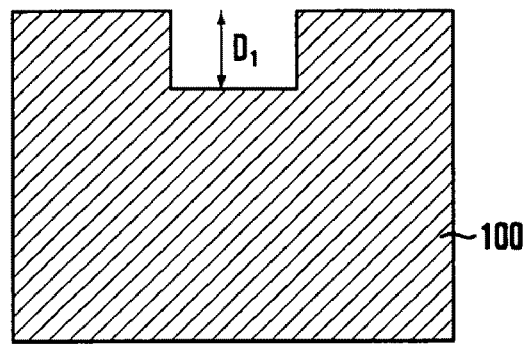
Figure 2C:
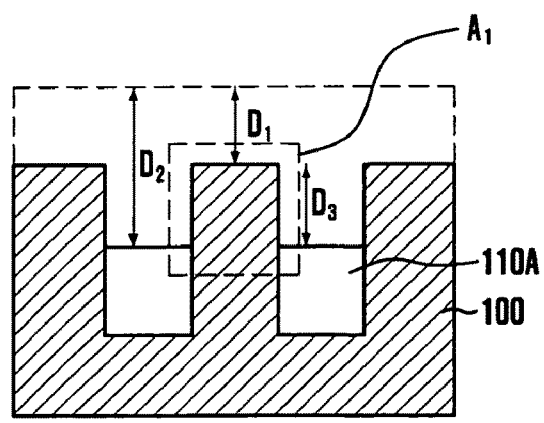
Figure 3A:
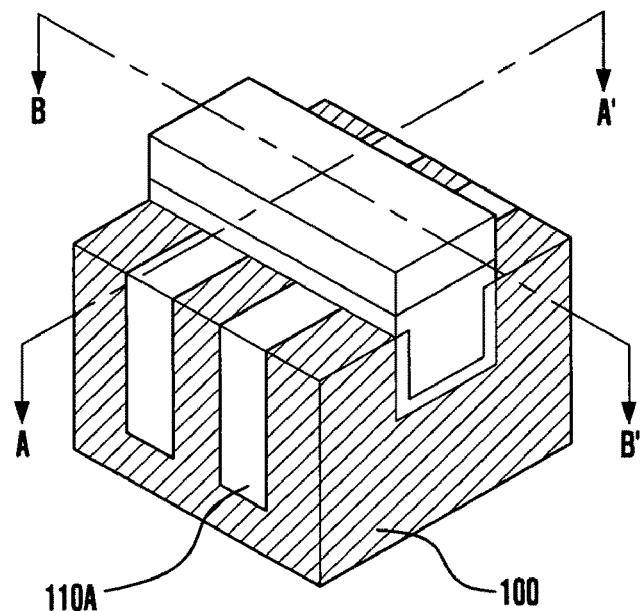
Figure 3B:
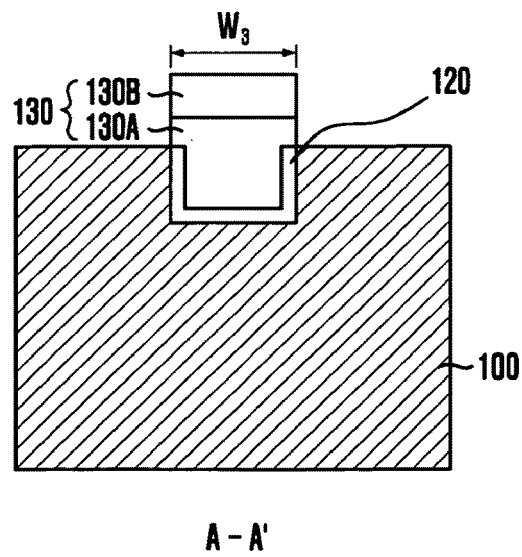
Figure 3C:
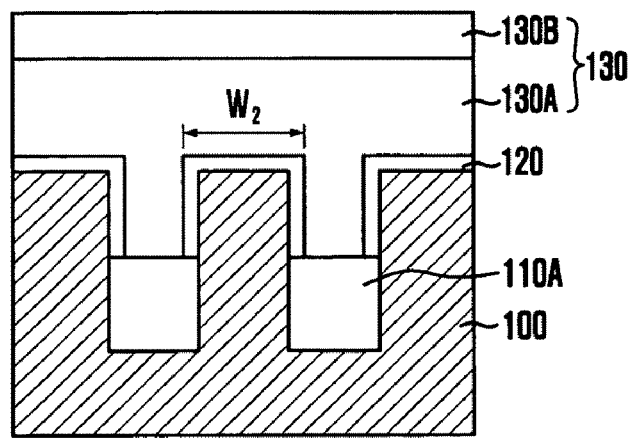
Figure 4A:
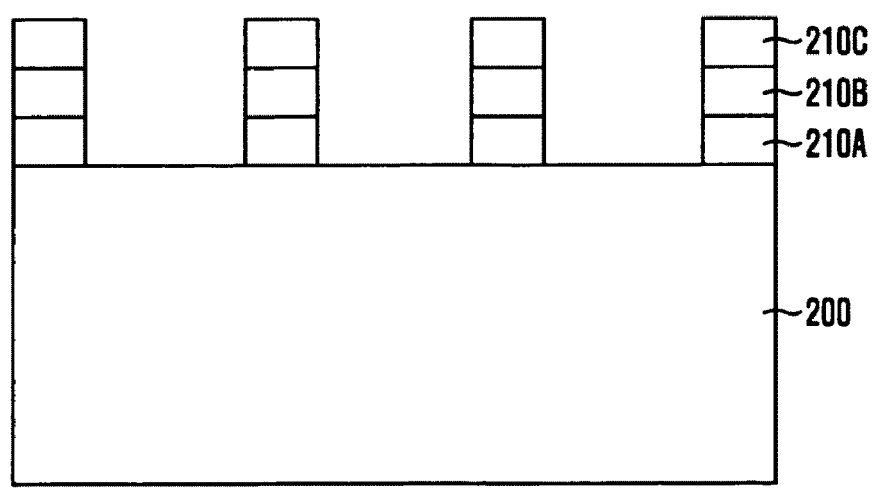
FIGS. 4A to 4C are cross-sectional views of stages in a method of forming a device isolation region in a semiconductor device in accordance with one or more embodiments.
Figure 4B:
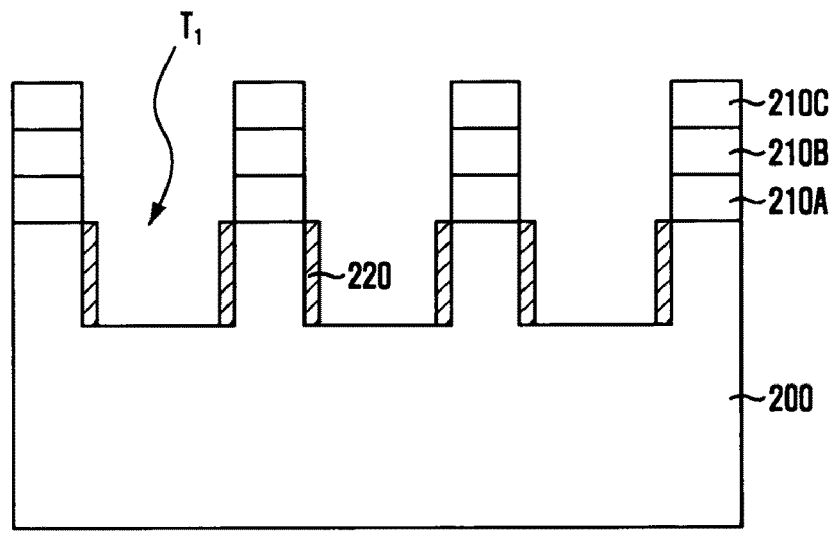
Figure 4C:
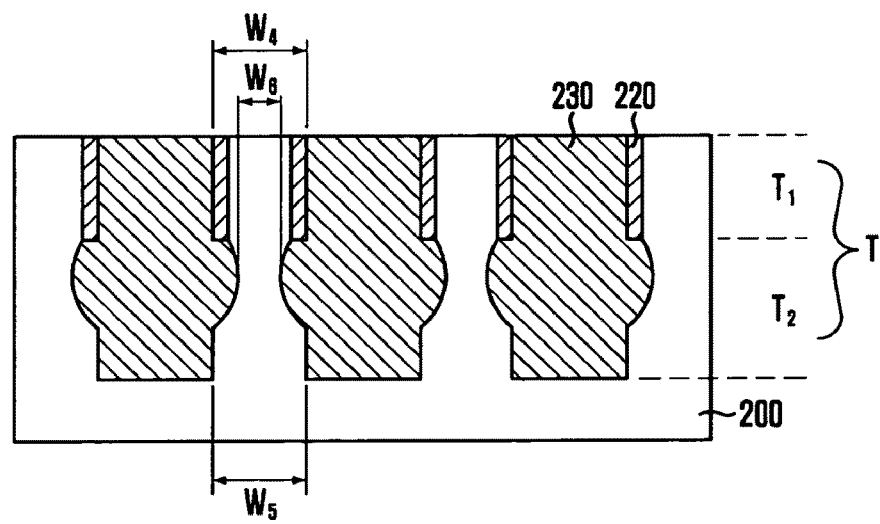

FIGS. 4A to 4C are cross-sectional views of stages in a method of forming a device isolation region in a semiconductor device in accordance with one or more embodiments.

Referring to FIG. 4A, a pad oxide pattern 210A, a pad nitride pattern 210B, and a hard mask pattern 210C are formed over a substrate 200. In one or more embodiments, the pad nitride pattern 210B is used as an etch stop layer during a planarization process of a subsequent device isolation region, and the hard mask pattern 210C includes an oxide-based layer.

In more detail, a pad oxide layer, a pad nitride layer, and a hard mask layer are formed over the substrate 200. A photoresist pattern (not shown) for forming a device isolation region is formed over the hard mask layer. For instance, the photoresist pattern includes line structures formed to have a certain spacing distance. The photoresist pattern may include argon fluoride (ArF) photoresist.

The hard mask layer, the pad nitride layer, and the pad oxide layer are etched to expose surfaces of the substrate 200 using the photoresist pattern as an etch barrier. Thus, the hard mask pattern 210C, the pad nitride pattern 210B, and the pad oxide pattern 210A are formed. For instance, in one or more embodiments, etching the hard mask layer, the pad nitride layer, and the pad oxide layer includes using a fluorine-based plasma gas. In particular, oxygen ($O_2$) gas and argon (Ar) gas may be added to the fluorine-based plasma gas when etching the hard mask layer, the pad nitride layer, and the pad oxide layer.

For instance, the hard mask layer, the pad nitride layer, and the pad oxide layer may be etched using a transformer coupled plasma (TCP) or inductively coupled plasma (ICP) type plasma source apparatus at a pressure ranging from approximately 30 mTorr to approximately 100 mTorr using a source power ranging from approximately 300 W to approximately 500 W.

In FIGS. 4B and 4C, stages in one or more embodiments of a method of forming device isolation trenches having protruding portions at sidewalls are described in detail.

Referring to FIG. 4B, portions of the substrate 200 are etched to a certain depth to form first trenches $T_1$ using the hard mask pattern 210C, the pad nitride pattern 210B, and the pad oxide pattern 210A as an etch barrier. The first trenches $T_1$ include vertically formed sidewalls.

The formation process of the first trenches $T_1$ may include using a plasma gas comprising fluorine and hydrogen. For instance, in one or more embodiments, the formation process of the first trenches $T_1$ includes using $C_xF_x$ gas and $CHF_x$ gas at a ratio ranging approximately 1:1-3.

Also, the formation process of the first trenches $T_1$ may include performing a taper etch process. Spacers 220 may be formed on the sidewalls of the first trenches $T_1$ by depositing etch by-products generated during the etching of the substrate 200. The spacers 220 function as an etch barrier during a subsequent process for etching second trenches.

For example, when forming the first trenches $T_1$, oxygen gas and argon gas may be additionally used to form the spacers 220 including a silicon dioxide ($SiO_2$) layer on the sidewalls of the first trenches $T_1$.

Otherwise, the spacers 220 may be formed on the sidewalls of the first trenches $T_1$ by adding a gas with a high hydrogen content, e.g., $CH_x$ gas, at a flow rate of approximately 5 sccm to approximately 20 sccm.

The formation process of the first trenches $T_1$ may be performed using a TCP or ICP type plasma source apparatus at a pressure ranging from approximately 30 mTorr to approximately 100 mTorr and using a source power ranging from approximately 300 W to approximately 500 W and a bias power ranging from approximately 50 W to approximately 500 W.

Referring to FIG. 4C, portions of the substrate 200 are further etched to form second trenches $T_2$ using the spacers 220 as an etch barrier. The second trenches $T_2$ are connected to the first trenches $T_1$ and have protruding portions at sidewalls in a manner that the width of the second trenches $T_2$ at the protruding portions is larger than the width of the first trenches $T_1$. Consequently, device isolation trenches T including the first trenches $T_1$ and second trenches $T_2$ are formed. The device isolation trenches T are formed to have the protruding portions at sidewalls.

In one or more embodiments, the formation process for forming the second trenches $T_2$ includes using a TCP, ICP, decoupled plasma source (DPS), magnetically enhanced reactive ion etch (MERIE), herical, helicon, or electron cyclotron resonance (ECR) type plasma source apparatus, applying a source voltage ranging from approximately 300 W to approximately 1,000 W and supplying a bias voltage ranging from approximately 100 W to approximately 500 W at a pressure ranging from approximately 5 mTorr to approximately 30 mTorr.

Also, the formation process for forming the second trenches $T_2$ may include using a chlorine-based gas and a bromine-based gas. For instance, chlorine ($Cl_2$) gas may flow in an amount ranging from approximately 10 sccm to approximately 50 sccm and hydrogen bromide (HBr) gas may flow in an amount ranging from approximately 50 sccm to approximately 100 sccm. Thus, the second trenches $T_2$ having the protruding portions at the sidewalls are formed.

In one or more embodiments, an insulation layer is formed over the substrate structure. The insulation layer may include a high density plasma (HDP) oxide layer. A planarization process is performed on the substrate structure until the surfaces of the substrate 200 are exposed to form insulation structures buried in the device isolation trenches T. The insulation structures buried in the device isolation trenches T are referred to as device isolation regions 230 hereinafter. Thus, the device isolation regions 230 define active regions of the substrate 200.

In accordance with one or more embodiments, the device isolation regions 230 are formed to have protruding portions at sidewalls in the vicinity of the center of the structure. The protruding portions of the device isolation regions 230 are formed along the profile of the protruding portions of the second trenches $T_2$. Thus, portions of the active regions in contact with the protruding portions of the device isolation regions 230 are formed to have a structure where sidewalls in the vicinity of the center of the structure are concaved. Therefore, a central width $W_6$ of the active regions in the vicinity of the center of the structure decreases, whereas an upper width $W_4$ and a bottom width $W_5$ are maintained to be larger than $W_6$.

Consequently, a typical profile may be maintained during a device isolation region formation process and a landing plug contact (LPC) process while selectively decreasing the central width $W_6$ of active regions in the vicinity of the center of the structure.

Therefore, when forming a saddle fin type transistor using the above described method of forming a device isolation region, portions of active regions in the vicinity of the center of the structure comprise fin active regions which protrude vertically from surfaces of the device isolation region. Thus, memory device characteristics may be improved by reducing the width of the fin active regions.

Although the above description relates to protruding portions formed in the vicinity of the center of device isolation region structures, in one or more embodiments, the protruding portions may be formed around an upper portion of the device isolation regions. In other words, in one ore more embodiments, the device isolation regions include device isolation trenches including first trenches having protruding portions at sidewalls and second trenches having vertically formed sidewalls.

In one or more embodiments where the protruding portions are formed around the upper portion of the device isolation regions, portions of active regions in contact with the protruding portions of the device isolation regions are formed in a manner that sidewalls around an upper portion of the active regions are concaved. In other words, the width of the upper portion of the active regions may be selectively reduced while maintaining the width of a bottom portion of the active regions to be larger.

When forming a fin type transistor using the above described structure, upper portions of active regions comprise fin active regions which protrude vertically from surfaces of device isolation regions. Memory device characteristics may be improved because the fin active regions have a smaller width than bottom portions.

Figure 5A:
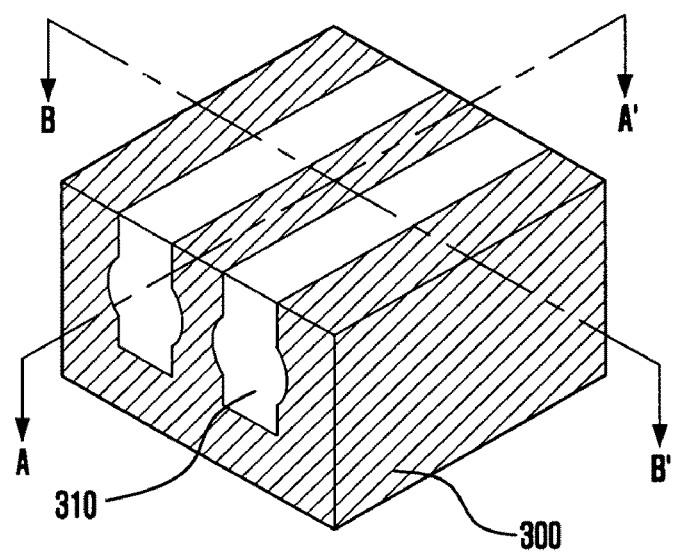
FIGS. 5A to 7C are views of stages in a method of fabricating a saddle fin type transistor in accordance with one or more embodiments.
Figure 5B:
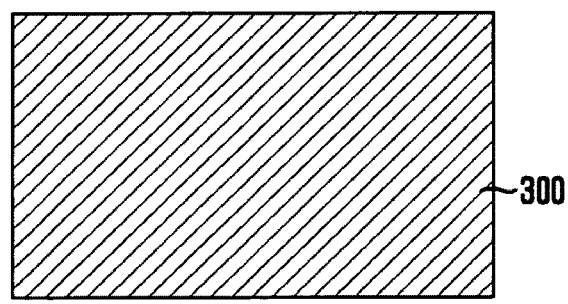
Figure 5C:
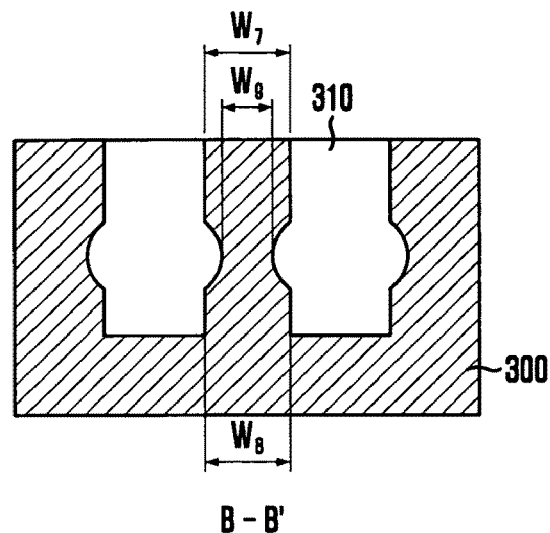
Figure 6A:
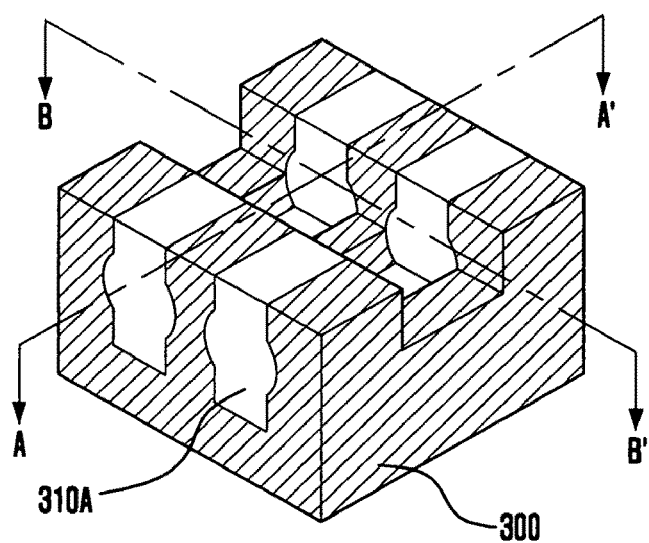
Figure 6B:
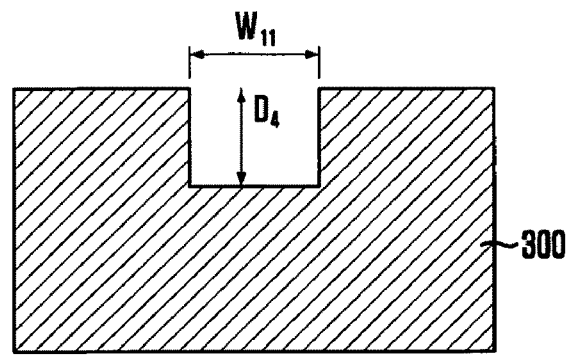
Figure 6C:
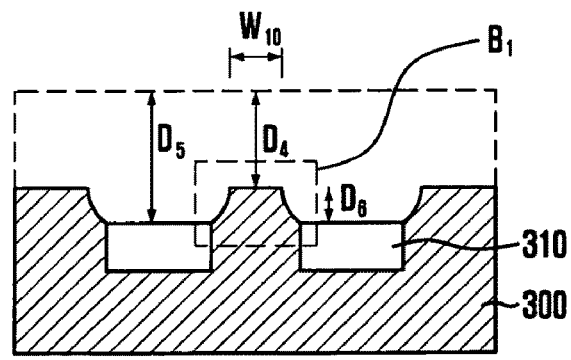
Figure 7A:
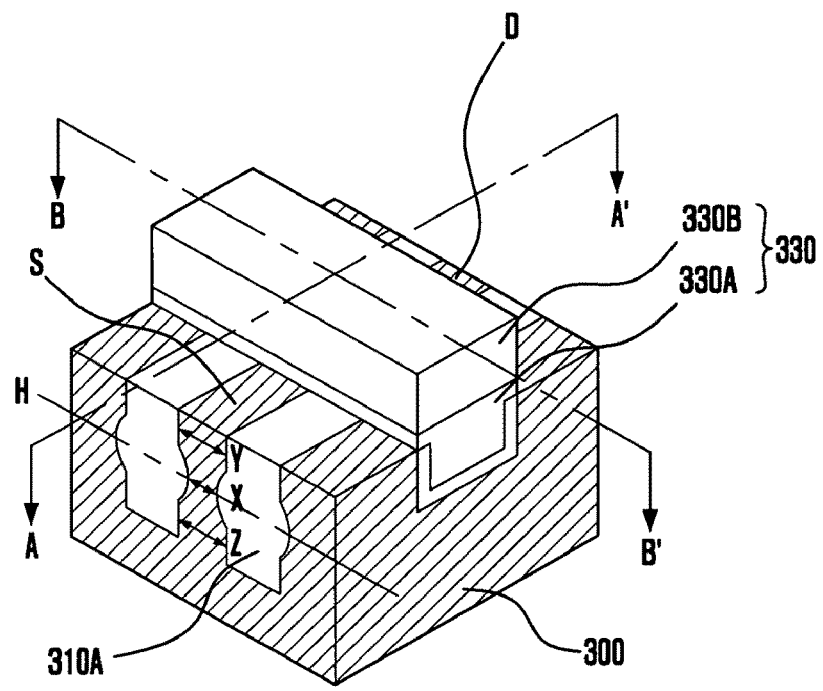
Figure 7B:
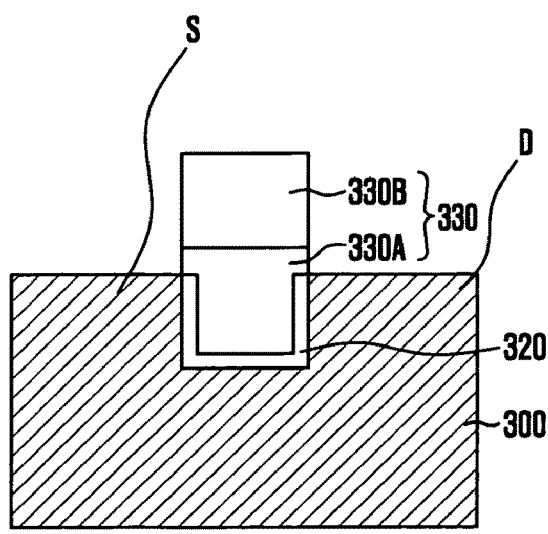
Figure 7C:
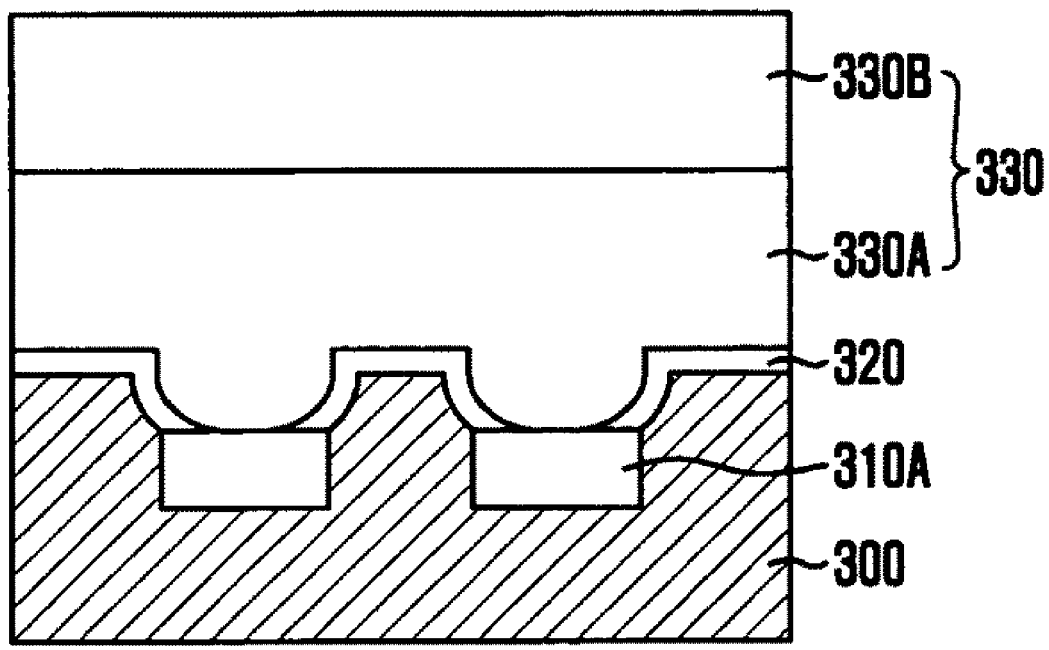

FIGS. 5A to 7C are views of stages in a method of fabricating a saddle fin type transistor in accordance with one or more embodiments. FIGS. 5A, 6A, and 7A are perspective views of stages in the method of forming a saddle fin type transistor. FIGS. 5B, 6B, and 7B are cross-sectional views taken along a first direction A-A' of the saddle fin type transistor shown in FIGS. 5A, 6A, and 7A, respectively. FIGS. 5C, 6C, and 7C are cross-sectional views taken along a second direction B-B' of the saddle fin type transistor shown in FIGS. 5A, 6A, and 7A, respectively.

Referring to FIGS. 5A to 5C, device isolation regions 310 have protruding portions at sidewalls over a substrate 300. The device isolation regions 310 define active regions of the substrate 300.

In more detail, a pad oxide layer (not shown), a pad nitride layer (not shown), and a hard mask layer (not shown) are formed over the substrate 300. A photoresist pattern (not shown) is formed over the hard mask layer, the photoresist pattern having a certain spacing distance and extended along the first direction A-A'. The hard mask layer, the pad nitride layer, the pad oxide layer, and the substrate 300 are etched to a certain depth to form first trenches using the photoresist pattern as an etch barrier. The first trenches are formed to have vertical sidewalls. Etch by-products generated during the etching are deposited over the sidewalls of the first trenches to form spacers (not shown).

Portions of the substrate 300 are further etched using the spacers as an etch barrier to form second trenches having protruding portions at sidewalls and connected to the first trenches. Thus, device isolation trenches including the first and second trenches are formed.

An insulation layer is formed over the substrate structure. The insulation layer may include a HDP oxide layer. A planarization process is performed on the substrate structure until surfaces of the substrate 300 are exposed. Thus, the device isolation regions 310 are buried in the device isolation trenches, defining the active regions.

A central width $W_9$ of the active regions decreases due to the protruding portions of the device isolation regions 310 while an upper width $W_7$ and a bottom width $W_8$ of the active regions are maintained to be larger than the upper width $W_7$ and the bottom width $W_8$ of the active regions.

Referring to FIGS. 6A to 6C, a photoresist pattern (not shown) is formed over the substrate structure. The photoresist pattern is formed in a manner to expose a gate line region. The gate line region refers to a region where a subsequent gate line is to be formed. The gate line region is formed to intersect the active regions, extended along the second direction B-B'.

Exposed portions of the active regions and the device isolation regions 310 are selectively etched to form a saddle fin type structure using the photoresist pattern as an etch barrier. Reference denotation 310A represents etched device isolation regions 310A.

In more detail, the exposed portions of the active regions are etched to a first depth $D_4$ to form a recess type structure using the photoresist pattern as an etch barrier. The exposed portions of the device isolation regions 310 are etched deeper than the first depth $D_4$ to a second depth $D_5$ using the photoresist pattern as an etch barrier. Thus, the etched device isolation regions 310A are formed. Consequently, a fin type structure where the etched active regions vertically protrude is formed. As a result, a saddle fin type structure including the recess type structure and the fin type structure is formed.

For instance, the process for forming the saddle fin type structure is performed under the condition of a high etch selectivity between the substrate 300 and the device isolation regions 310. Also, when forming the saddle fin type structure, etching the active regions may be performed after the device isolation regions 310 are etched.

In the saddle fin type structure, portions of the etched active regions protruding vertically from surfaces of the etched device isolation regions 310A are referred to as fin active regions $B_1$. The first depth $D_4$ and the second depth $D_5$ are controlled in a manner that the fin active regions $B_1$ and the protruding portions of the device isolation trenches are in contact. At this time, a height of the fin active region $B_1$ is represented by reference arrow $D_6$ and corresponds to the height difference between the first depth $D_4$ and the second depth $D_5$. Side portions of the fin active regions $B_1$ are formed to have a slope less steep than that of the etched active regions buried between the etched device isolation regions 310A. In other words, while the etched active regions buried between the etched device isolation regions 310A have vertically formed side portions, the side portions of the fin active regions $B_1$ were etched to a certain thickness during a previous process to obtain sloped side portions.

In accordance with one or more embodiments, the sidewalls of the fin active regions $B_1$ are etched to a certain thickness by forming the protruding portions at the sidewalls of the device isolation trenches during the etching process of the substrate 300 to form the device isolation trenches.

In this case, the fin active regions $B_1$ are formed to be in contact with the protruding portions of the device isolation trenches. Thus, an upper width $W_{10}$ of the fin active regions $B_1$ have a smaller value than a width of the fin active regions $B_1$ between device isolation regions 310. Therefore, the ratio between the upper width $W_{10}$ and a length $W_{11}$ of the fin active regions $B_1$ may be improved, enhancing memory device characteristics.

Referring to FIGS. 7A to 7C, a gate insulation layer 320 is formed over a portion of the substrate structure. A gate line 330 is formed over the gate line region. The gate line 330 includes a stack structure of a first conductive layer 330A and a second conductive layer 330B.

An impurity ion implantation process is performed on portions of the active regions on both sides of the gate line 330 to form source and drain regions. Reference characters S and D represent source regions and drain regions, respectively. Portions of the source and drain regions S and D corresponding to the level of the fin active regions $B_1$ (refer to reference character H in FIG. 7A) have a corresponding width X which is smaller than an upper width Y and a bottom width Z of the source and drain regions. The portions corresponding to the level of the fin active regions $B_1$ refer to regions in contact with the protruding portions of the etched device isolation regions 310A. While the corresponding width X of the active regions is decreased by the protruding portions of the etched device isolation regions 310A, the upper width Y and the bottom width Z are not reduced because upper and bottom portions of the active regions are in contact with portions having vertical sidewalls of the etched device isolation regions 310A.

Figure 8:
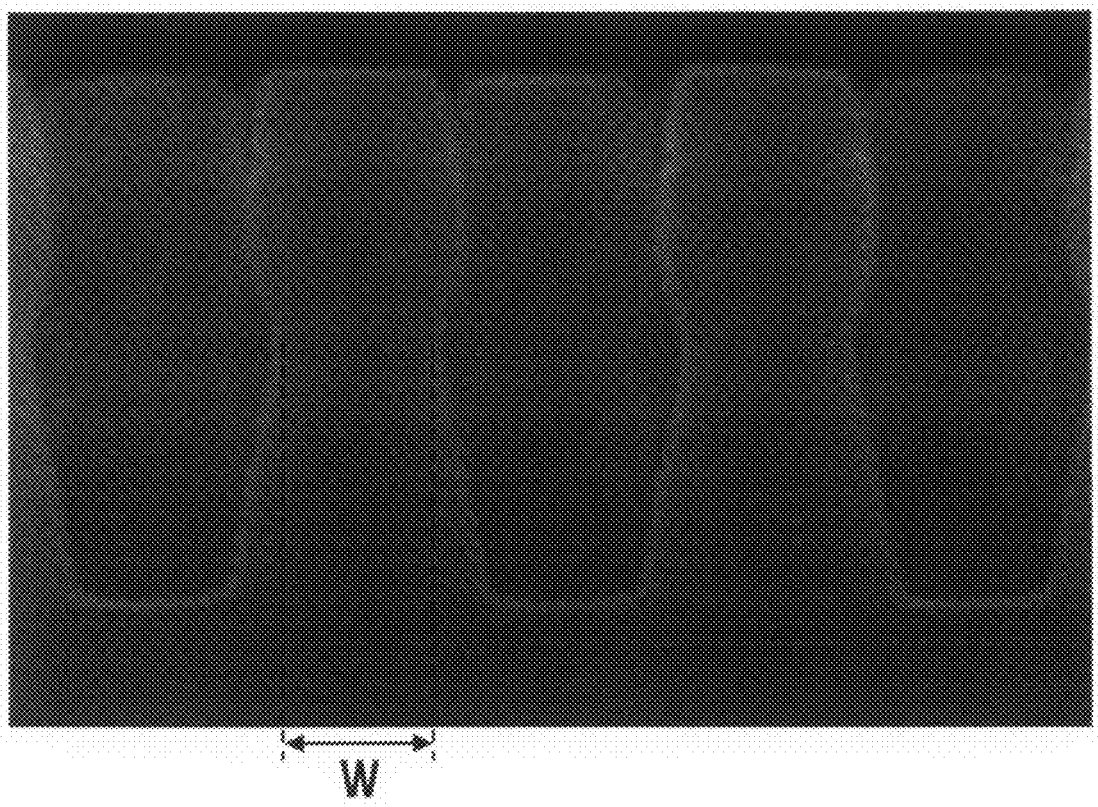
FIG. 8 is a micrographic view of a device isolation region in accordance with one or more embodiments.

FIG. 8 is a micrographic view of device isolation regions in accordance with one or more embodiments.

Referring to FIG. 8, a width W of active regions may be selectively reduced by forming device isolation regions having protruding portions at sidewalls over a substrate. Thus, the width of portions of the active regions may be selectively decreased, and consequently the width of fin active regions may also be reduced. As a result, memory device characteristics may be improved.

While one or more specific embodiments have been described, it will be apparent to those skilled in the art that various changes and modifications may be made.

What is claimed is:

1. A method of fabricating a semiconductor device, comprising:
    forming a hard mask layer over a substrate;
    etching portions of the hard mask layer and the substrate to form trenches having protruding portions at sidewalls;
    forming an insulation layer buried in the trenches to form device isolation regions having protruding portions at sidewalls; and
    forming a gate line on the protruding portion,
    wherein the device isolation regions decrease a portion of a width of active regions,
    wherein the trenches comprises first trenches having first vertical sidewalls and second trenches having the protruding portions and second vertical sidewalls,
    wherein the second vertical sidewalls are formed below the protruding portions.

2. The method of claim 1, wherein the hard mask layer and the substrate are etched to form the trenches by:
    etching the hard mask layer and the substrate to a certain depth to form the first trenches having the first vertical sidewalls; and
    etching the etched portion of the substrate to form the second trenches connected to the first trenches and having the protruding portions at sidewalls.

3. The method of claim 2, wherein the hard mask layer and the substrate are etched to form the first trenches by generating etch by-products and depositing the etch by-products over the first vertical sidewalls of the first trenches to form spacers, and the etched portion of the substrate is etched to form the second trenches by using the spacers.

4. The method of claim 3, wherein the hard mask layer and the substrate are etched to form the first trenches by adding oxygen ($O_2$) gas and argon (Ar) gas to form the spacers including silicon dioxide ($SiO_2$) over the first vertical sidewalls of the first trenches.

5. The method of claim 3, wherein the hard mask layer and the substrate are etched to form the first trenches by adding a gas with a high hydrogen content.

6. The method of claim 2, wherein the etched portion of the substrate is etched to form the second trenches by supplying a source voltage between 300 W and 1,000 W and a bias voltage between 100 W and 500 W at a pressure between 5 mTorr and 30 mTorr.

7. The method of claim 2, further comprising, after the device isolation regions are formed:
    forming a photoresist pattern for forming the gate line over the substrate; and
    etching exposed portions of the active regions and the device isolation regions to a certain depth to form a saddle fin type structure using the photoresist pattern.

8. The method of claim 7, wherein the exposed portions of the active regions and the device isolation regions are etched to form the saddle fin type structure by:

selectively etching upper portion of the active regions and the device isolation regions to a first depth; and etching the etched device isolation regions to a second depth such that upper portions of the etched active regions protrude from upper surfaces of the etched device isolation regions, wherein the second depth is larger than the first depth.

9. The method of claim 8, wherein the exposed portions of the active regions and the device isolation regions are etched to form the saddle fin type structure by controlling the first depth and the second depth in a manner that the upper portions of the etched active regions protruding from the upper surfaces of the etched device isolation regions are in contact with the protruding portions at the sidewalls of the second trenches.

10. The method of claim 1, wherein the hard mask layer and the substrate are etched to form the trenches by:

etching the hard mask layer and the substrate to a certain depth to form the first trenches having the first vertical sidewalls; and etching the etched substrate to form the second trenches connected to the first trenches and having the protruding portions and the second vertical sidewalls.

11. The method of claim 10, further comprising, after the device isolation regions are formed, etching portions of the device isolation regions to form a fin type structure wherein upper portions of the active regions protrude from upper surfaces of the etched device isolation regions.

12. The method of claim 1, wherein a width of the second vertical sidewalls is identical to a width of the first vertical sidewalls.

* * * * *